(12) United States Patent
Yamauchi et al.

(10) Patent No.: US 7,633,123 B2
(45) Date of Patent: Dec. 15, 2009

(54) SEMICONDUCTOR DEVICE HAVING SUPER JUNCTION STRUCTURE

(75) Inventors: Shoichi Yamauchi, Obu (JP); Hitoshi Yamaguchi, Nisshin (JP); Yoshiyuki Hattori, Aichi-gun (JP); Kyoko Okada, Nagoya (JP)

(73) Assignee: Denso Corporation, Kariya (JP)

( * ) Notice: Subject to any disclaimer, the term of this patent is extended or adjusted under 35 U.S.C. 154(b) by 527 days.

(21) Appl. No.: 11/645,792

(22) Filed: Dec. 27, 2006

(65) Prior Publication Data

US 2007/0145479 A1  Jun. 28, 2007

(30) Foreign Application Priority Data

Dec. 27, 2005  (JP) .............................. 2005-374170

(51) Int. Cl.
*H01L 29/76* (2006.01)
(52) U.S. Cl. ............... 257/341; 257/342; 257/E29.027; 257/E29.257
(58) Field of Classification Search ................. 257/341, 257/342, E29.027, E29.257
See application file for complete search history.

(56) References Cited

U.S. PATENT DOCUMENTS

| | | | |
|---|---|---|---|
| 6,040,600 A | 3/2000 | Uenishi et al. | |
| 6,103,578 A | 8/2000 | Uenishi et al. | |
| 6,512,268 B1 | 1/2003 | Ueno | |
| 6,844,592 B2 | 1/2005 | Yamaguchi et al. | |
| 6,949,798 B2 * | 9/2005 | Nitta et al. | 257/341 |
| 7,112,519 B2 | 9/2006 | Yamaguchi et al. | |
| 7,115,475 B2 | 10/2006 | Yamaguchi et al. | |
| 7,498,635 B2 * | 3/2009 | Kitagawa et al. | 257/343 |
| 7,541,643 B2 * | 6/2009 | Ono et al. | 257/341 |
| 7,554,155 B2 * | 6/2009 | Saito et al. | 257/341 |
| 2004/0016959 A1 | 1/2004 | Yamaguchi et al. | |

FOREIGN PATENT DOCUMENTS

JP  A-2000-260984  11/2005

OTHER PUBLICATIONS

C. Rochefort and R. van Dalen, "A scalable trench etch based process for high voltage vertical Resurf MOSFETs," *Proceedings of the 17th International Symposium on Power Semiconductor Devices & IC's,* May 23-26, 2005, pp. 35-38 (Discussed on p. 2 of the specification).

* cited by examiner

*Primary Examiner*—Trung Dang
(74) *Attorney, Agent, or Firm*—Posz Law Group, PLC

(57) ABSTRACT

A semiconductor device includes: two main electrodes; multiple first regions; and multiple second regions. The first region having a first impurity concentration and a first width and the second region having a second impurity concentration and a second width are alternately repeated. A product of the first impurity concentration and the first width is equal to a product of the second impurity concentration and the second width. The first width is equal to or smaller than 4.5 μm. The first impurity concentration is lower than a predetermined concentration satisfying a RESURF condition. A ratio between on-state resistances of the device at 27° C. and at 150° C. is smaller than 1.8.

7 Claims, 7 Drawing Sheets

SEMICONDUCTOR DEVICE HAVING SUPER JUNCTION STRUCTURE

CROSS REFERENCE TO RELATED APPLICATION

This application is based on Japanese Patent Application No. 2005-374170 filed on Dec. 27, 2005, the disclosure of which is incorporated herein by reference.

FIELD OF THE INVENTION

The present invention relates to a semiconductor device having a super junction structure.

BACKGROUND OF THE INVENTION

To increase a breakdown voltage, a semiconductor device having a region (i.e., a drift region) including a low impurity concentration is disclosed.

By using the drift region, the breakdown voltage of the device is increased. However, an on-state resistance of the device is also increased. Accordingly, it is required to increase the breakdown voltage together with reducing the on-state resistance. In view of this requirement, a super junction structure is proposed. The super junction structure has a first region including a first conductive type impurity and a second region including a second conductive type impurity. The first region extends along with a direction connecting between a pair of main electrodes. The second region extends in parallel to the first region. The first conductive type in the first region is equal to a conductive type of a carrier moving between the main electrodes. In the super junction structure, a combination of the first and second regions is repeated in the plane, on which the main electrodes expand. In the plane, the first region is sandwiched between two of the second regions, and the second region is sandwiched between two of the first regions.

FIG. 11 shows an on-state resistance of a semiconductor device disclosed in ISPSD Proceedings, 2005, pages 35-38. A vertical axis represents the on-state resistance, and a horizontal axis represents a temperature of the device. A curve 62 in FIG. 11 represents the on-state resistance in a case where a cell pitch of a semiconductor element is 6 µm, and a curve 64 represents the on-state resistance in a case where a cell pitch of a semiconductor element is 6.2 µm. The on-state resistance of the curve 64 is smaller than that of the curve 62. Thus, to reduce the on-state resistance, it is preferred that the width of the first region sandwiched between the second regions becomes larger.

However, as shown in FIG. 11, the on-state resistance of the device is varied together with temperature change. To reduce the on-state resistance, the device is cooled so that an operation temperature of the device becomes constant.

Specifically, when the device switches electric power, the device generates heat. In general, it is preferred that the operation temperature of the device is disposed in a range between a room temperature (i.e., 27° C.) and 150° C. In the above device having the drift region, when the on-state resistance at 27° C. is defined as R1, and the on-state resistance at 150° C. is defined as R2, a ratio between R2 and R1 is equal to or larger than 18. When the device having the ratio of R2/R1 equal to or larger than 1.8 is used for a power switching device, high performance cooling equipment is required to cool the device and to maintain the operation temperature in a narrow range such as in a range between 27° C. and 150° C. The cooling equipment has a heat radiation plate and a coolant water passage, which have complicated design.

Thus, it is required to decrease a change rate of the on-state resistance with respect to temperature. Specifically, it is required to reduce the ratio of R2/R1 equal to or smaller than 1.8. In this case, required cooling performance of cooling equipment for the device can be reduced. Thus, the cooling equipment is minimized and simplified, so that the dimensions of the device are reduced.

SUMMARY OF THE INVENTION

In view of the above-described problem, it is an object of the present disclosure to provide a semiconductor device having a super junction structure.

According to an aspect of the present disclosure, a semiconductor device includes: a pair of main electrodes for conducting a carrier having a first conductive type therebetween; a plurality of first regions having the first conductive type and extending along with an extending direction, which is parallel to a direction connecting between the pair of main electrodes; and a plurality of second regions having a second conductive type and extending along with the extending direction. The first regions and the second regions are alternately repeated along with a repeat direction perpendicular to the extending direction so that each first region is sandwiched between two of the second regions and each second region is sandwiched between two of the first regions. The first region has a first impurity concentration and a first width, which is measured along with the repeat direction. The second region has a second impurity concentration and a second width, which is measured along with the repeat direction. A product of the first impurity concentration and the first width is equal to a product of the second impurity concentration and the second width. The first width is equal to or smaller than 4.5 µm. The first impurity concentration is lower than a predetermined impurity concentration satisfying a RESURF condition. The device has an on-state resistance at 27° C. defined as R1 and another on-state resistance at 150° C. defined as R2. A ratio between the on-state resistance of R2 and the on-state resistance of R1 is smaller than 1.8.

In the above device, the on-state resistance is comparatively low, the breakdown voltage is comparatively high, and the change rate of the on-state resistance with respect to temperature is small.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 4:
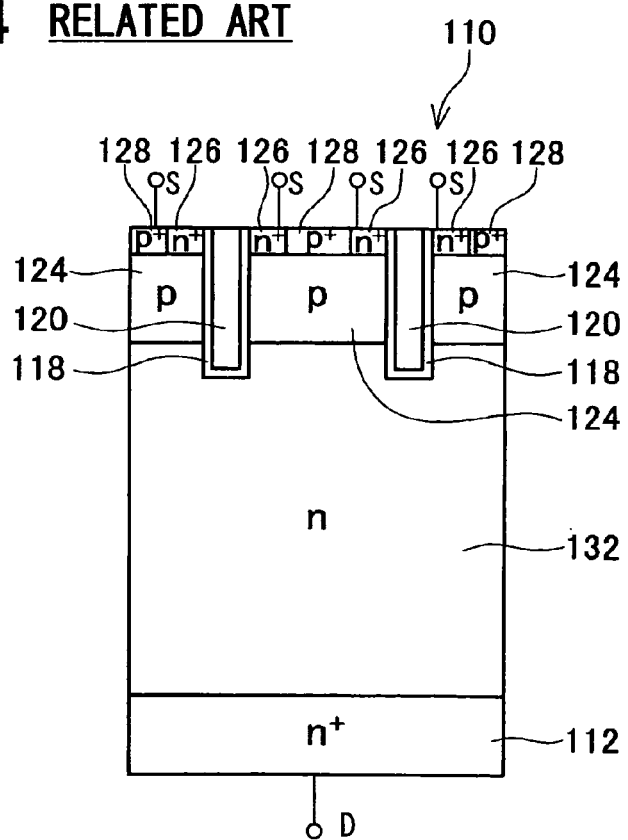
FIG. 4 is a cross sectional view showing a semiconductor device according to a related art.

The inventors have studied about a super junction structure and an on-state resistance changeable in accordance with temperature. Firstly, a MOSFET having a super junction structure has been studied. In FIG. 4 the MOSFET 110 according to a related art includes a N+ conductive type drain layer 112 and a drift layer 132. The drift layer 132 is disposed on a surface of the drain layer 112. A P conductive type body layer 124 is formed on a surface of the drift layer 132. A N+ conductive type source region 126 and a P+ conductive body-contact region 128 are formed on a surface of the body layer 124. The body layer 124 separates the source region 126 from the drift layer 132. A trench gate electrode 120 is formed to penetrate the body layer 124. The trench gate electrode 120 is electrically isolated from the body layer 124 with an insulation film 118.

Figure 1:
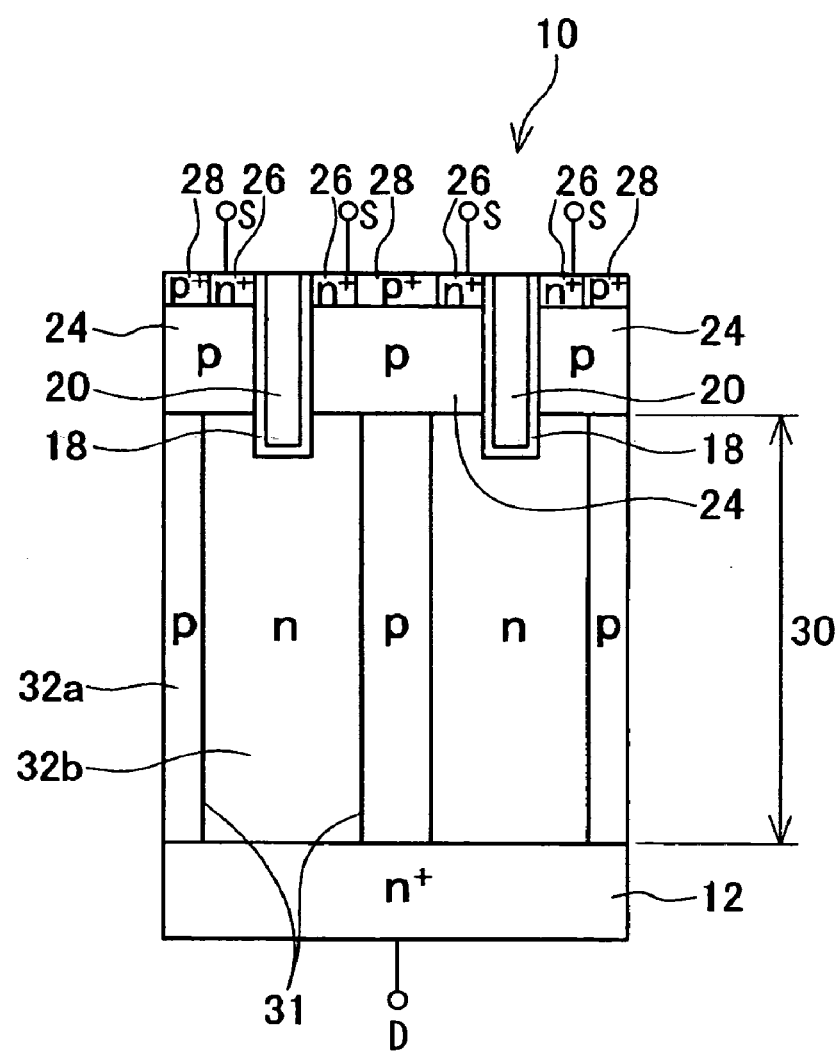
FIG. 1 is a cross sectional view showing a semiconductor device having a super junction structure.

In FIG. 1, a MOSFET 10 having a super junction structure 30 includes multiple P conductive type columns 32a and N conductive type columns 32b, which are alternately repeated. The super junction structure 30 provides a drift layer.

Figure 6:
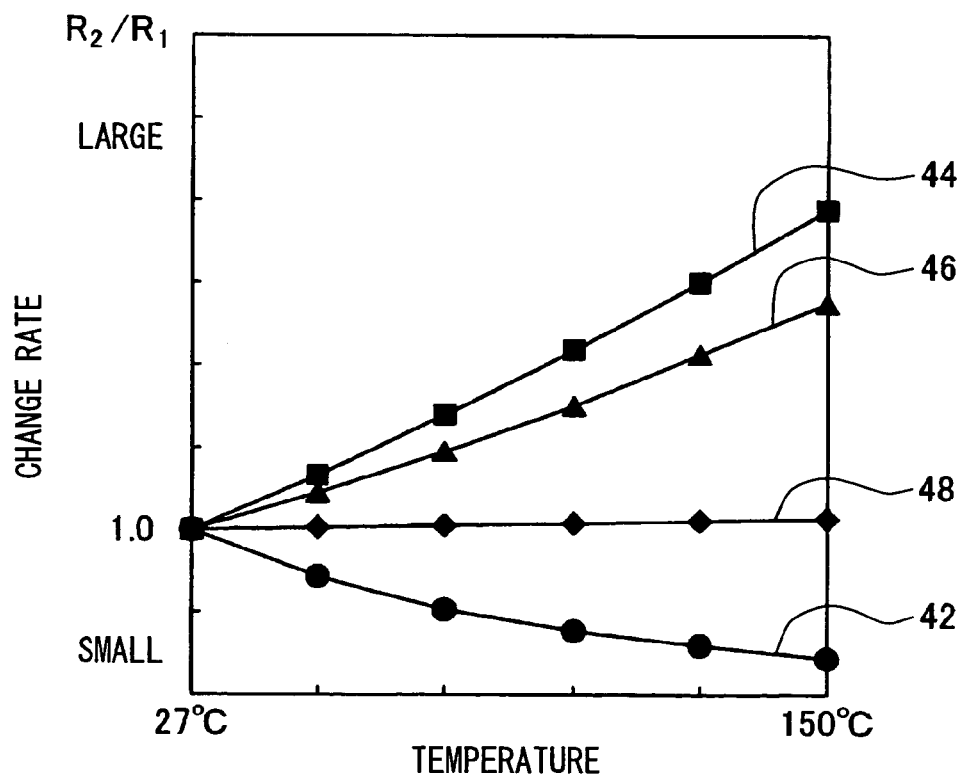
FIG. 6 is a graph showing a change rate of the on-state resistance with reference to temperature in the semiconductor device having the super junction structure.

A change rate of an on-state resistance with respect to temperature in the MOSFET 10 is shown in FIG. 6. In FIG. 6, the on-state resistance of the MOSFET 10 at 27° C. is a reference resistance. Here, the change rate of the on-state resistance is defined as follows.

$$(\text{CHANGE RATE}) = R2/R1 \tag{F1}$$

In the formula F1, R1 represents the on-state resistance of the MOSFET 10 at 27° C., and R2 represents the on-state resistance at a given temperature. In FIG. 6, a vertical axis represents the change rate of the on-state resistance, and a horizontal axis represents temperature of the device. A curve 42 represents the change rate of the on-state resistance in a case where the impurity concentration of the N conductive type column 32b is $1 \times 10^5$ cm$^{-3}$, a curve 44 represents the change rate in a case where the impurity concentration of the column 32b is $1 \times 10^{16}$ cm$^{-3}$, and a curve 46 represents the change rate in a case where the impurity concentration of the column 32b is $1 \times 10^{17}$ cm$^{-3}$. The width of the N conductive type column 32b is 1.4 μm, and the width of the P conductive type column 32a is 1.2 μm. A curve 48 will be explained latter.

By comparing between the curves 44, 46, the change rate of the on-state resistance with respect to temperature becomes small as the impurity concentration of the N conductive type column 32b increases.

Figure 5:
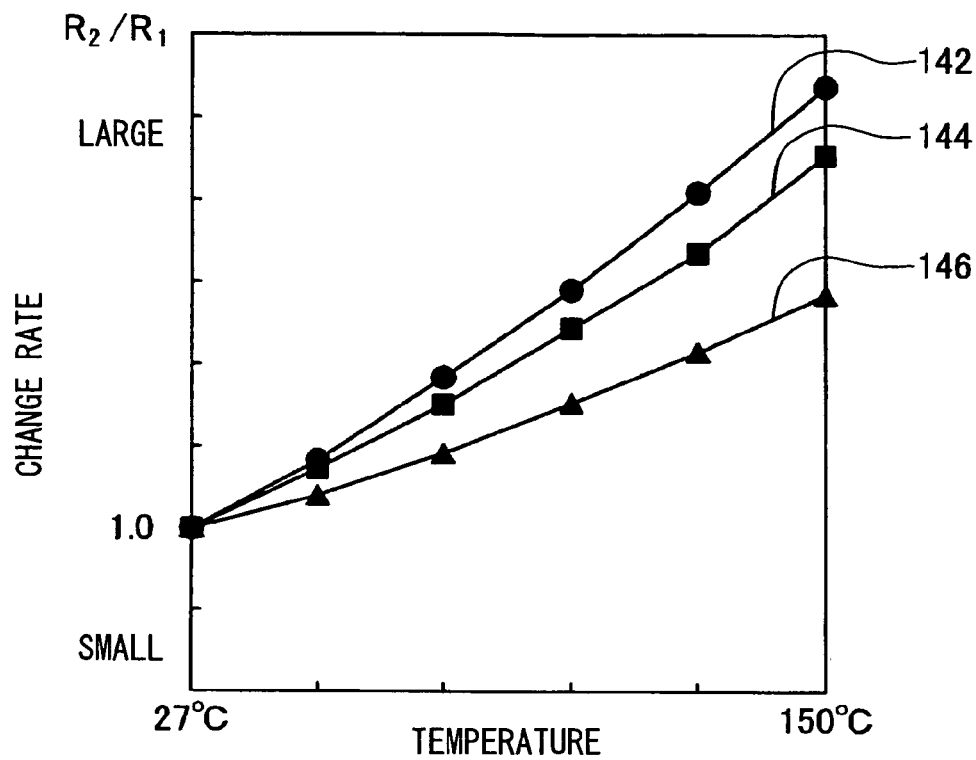
FIG. 5 is a graph showing a change rate of the on-state resistance with reference to temperature in the device according to the related art.

FIG. 5 shows the change rate of the on-state resistance of the MOSFET 110 as a comparison in a temperature range between 27° C. and 150° C. when the on-state resistance at 27° C. is a reference resistance. A curve 142 represents the change rate of the on-state resistance in a case where the impurity concentration of the N conductive type semiconductor layer is $1 \times 10^{15}$ cm$^{-3}$, a curve 144 represents the change rate in a case where the impurity concentration of the semiconductor layer is $1 \times 10^{16}$ cm$^{-3}$, and a curve 146 represents the change rate in a case where the impurity concentration of the semiconductor layer is $1 \times 10^{17}$ cm$^{-3}$.

As the impurity concentration of the N conductive type semiconductor layer becomes higher, the change rate of the on-state resistance with reference to temperature change becomes smaller. In the MOSFET 110, a part of the on-state resistance provides a drift resistance, the part being equal to or larger than 90%. Thus, the on-state resistance of the MOSFET 110 depends on mobility of electron in the N conductive type drift layer 132. Here, the mobility of electron is determined based on lattice scattering and impurity scattering. The lattice scattering is proportional to the temperature, so that the lattice scattering becomes hot when the temperature is high. However, the impurity scattering does not depend on the temperature increase. When the temperature increases, the lattice scattering becomes hot; and therefore, the mobility of electron is reduced. The resistance attributed to the lattice scattering becomes larger as the temperature increases. On the other hand, the resistance attributed to the impurity scattering is constant with reference to the temperature change.

When the impurity concentration of the N conductive type drift layer 132 is low, the resistance attributed to the lattice scattering becomes superior to the resistance attributed to the impurity scattering. Accordingly, the change rate of the on-state resistance with respect to the temperature becomes large. When the impurity concentration of the N conductive type drift layer 132 is high, the resistance attributed to the impurity scattering becomes superior to the resistance attributed to the lattice scattering. Accordingly, the change rate of the on-state resistance with respect to the temperature becomes smaller.

Also in the MOSFET 10 having the super junction structure 30 in the drift layer, the resistance attributed to the lattice scattering becomes superior to the resistance attributed to the impurity scattering when the impurity concentration of the N conductive type column 32b is low. Accordingly, the change rate of the on-state resistance with respect to the temperature becomes large. When the impurity concentration of the N conductive type column 32b is high, the resistance attributed to the impurity scattering becomes superior to the resistance attributed to the lattice scattering. Accordingly, the change rate of the on-state resistance with respect to the temperature becomes smaller. Thus, the change rate of the on-state resistance with reference to the temperature in the curve 46 is smaller than that in the curve 44.

When the super junction structure 30 provides the drift layer, the change rate of the on-state resistance with reference to the temperature has a negative temperature dependency in a case where the impurity concentration of the N conductive type column 32b is low, as shown the curve 42 in FIG. 6. Specifically, in this case, the impurity concentration of the N conductive type column 32b is lower than an impurity concentration meeting a RESURF condition, which provides depletion effect in the super junction structure 30 when a semiconductor device turns off. This negative dependency is confirmed by the inventors. The reason why the negative dependency is generated is explained as follows.

The resistance of the N conductive type column 32b in the super junction structure 30 is determined by the mobility of electron in addition to a depletion layer expanding from a PN junction interface 31 into the N conductive type column 32b.

Figure 7:
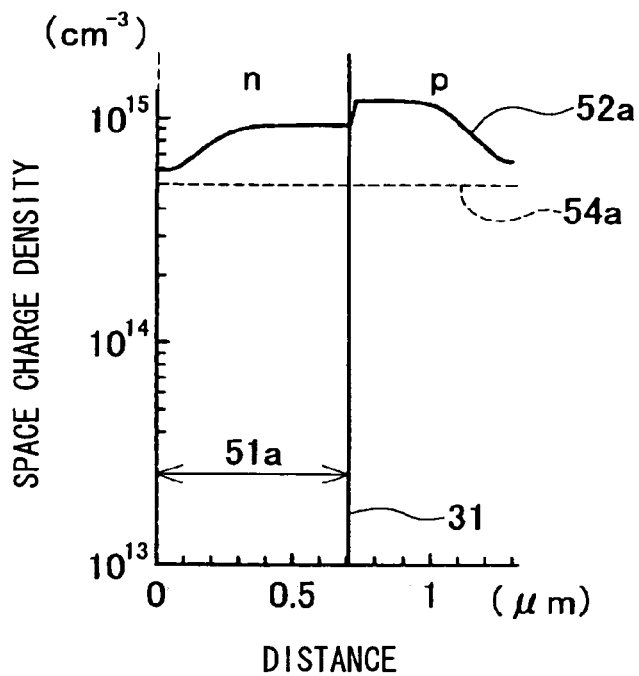
FIG. 7 is a graph showing a space charge density at 27° C. when the impurity concentration of an N conductive type column is $1 \times 10^{15}$ cm$^{-3}$.

FIG. 7 shows a relationship between space charge density and a depletion layer when the impurity concentration of the N conductive type column 32b is $1 \times 10^{15}$ cm$^{-3}$, the temperature is 27° C., and the MSFET 10 turns on. The vertical axis represents the space charge density, and the horizontal axis represents a distance along with a direction in parallel to a stacking direction of the N conductive type column 32b and the P conductive type column 32a. The width of the N conductive type column 32b is 1.4 µm. A half part of the N conductive type column 32b is shown in FIG. 7. A line 31 represents the PN junction interface between the N conductive type column 32b and the P conductive type column 32a. A dotted line 54a represents a half level of the impurity concentration of the N conductive type column 32b. The impurity concentration of the P conductive type column 32a is determined to provide a charge balance to the impurity concentration of the N conductive type column 32b.

The charge balance means that a product of the impurity concentration of the N conductive type column 32b and the width of the column 32b is equal to a product of the impurity concentration of the P conductive type column 32a and the width of the column 32a. In general, in a super junction structure 30 having first and second regions, which are alternately repeated, the charge balance between the first region and the second region is maintained.

Even when the charge balance is maintained in the MOSFET, the super junction structure may not be depleted completely when the MOSFET turns off. To deplete the super junction structure completely when the MOSFET turns off, it is required to set a product of the impurity concentration of the N conductive type column 32b and the width of the column 32b to be $2 \times 10^{12}$ cm$^{-2}$. In the present disclosure, this requirement is defined as the RESURF condition. The distance of the depletion layer expanding into the N conductive type column 32b depends on the impurity concentration of the N conductive type column 32b. When the impurity concentration of the N conductive type column 32b is low, the depletion layer expands in the column 32b with a long distance. When the impurity concentration of the N conductive type column 32b is high, the depletion layer expands in the column 32b with a short distance.

When the RESURF condition is satisfied, and the device turns off, the super junction structure is completely depleted. The RESURF condition is such that the structure is not completely depleted when the impurity concentration is higher than a predetermined concentration meeting the RESURF condition. Accordingly, the structure is completely depleted even when the impurity concentration is higher than a predetermined concentration meeting the RESURF condition.

Figure 2:
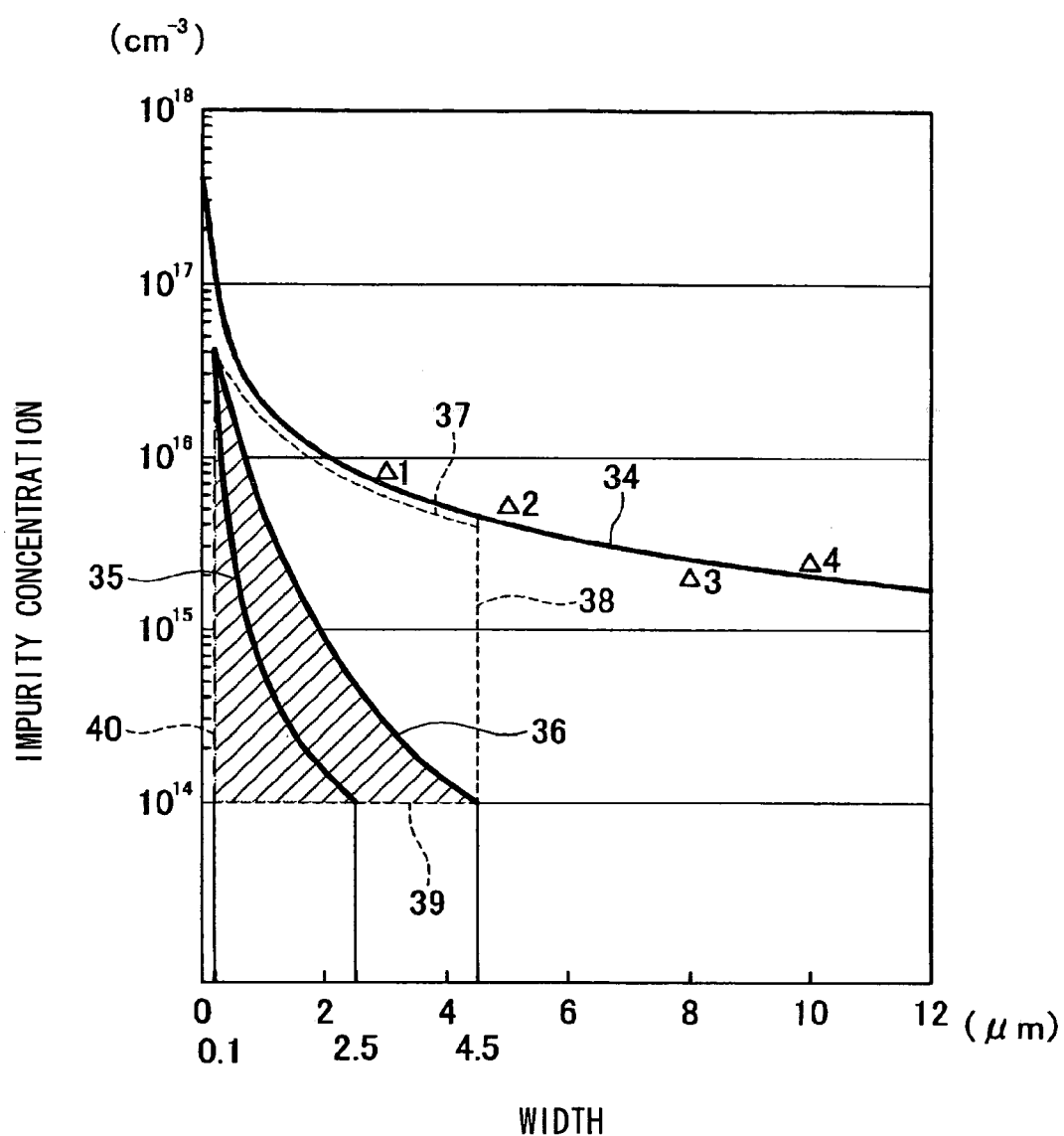
FIG. 2 is a graph showing a relationship between a width of a column and an impurity concentration of the column in the super junction structure.

A curve 34 in FIG. 2 shows a relationship between the width of the N conductive type column 32b and the impurity concentration of the column 32b, which meets the RESURF condition. The width of the column 32b is defined as a distance of the column 32b measured in a direction in parallel to the stacking direction of the first and second columns 32a, 32b. The vertical axis represents the impurity concentration of the column 32b, and the horizontal axis represents the width of the column 32b. A triangle point 1 shows the relationship between the impurity concentration and the width of a N conductive type column in a semiconductor device having a super junction structure, which is disclosed in JP-A-1998-223896, which corresponds to U.S. Pat. No. 6,103,578 and U.S. Pat. No. 6,040,600. Triangle points 2 to 4 show the relationship between the impurity concentration and the width of a N conductive type column in a semiconductor device having a super junction structure, which is disclosed in JP-A-2000-260984, in JP-A-2003-273355 (corresponding to U.S. Pat. No. 6,844,592 and U.S. Pat. No. 7,115,475) and in JP-A-2001-135819 (corresponding to U.S. Pat. No. 6,512,268), respectively. These points 1-4 satisfy the RESURF condition.

The curve 42 in FIG. 6, which shows the negative temperature dependency of the resistance change, and the expanding of the depletion layer shown in FIG. 7 are disposed below the curve 34 in FIG. 2. Specifically, these conditions are a case where the impurity concentration of the N conductive type column 32b is lower than a predetermined concentration satisfying the RESURF condition. Thus, these conditions are different from the prior art.

In FIG. 7, the range, in which the space charge density is equal to or larger than a half of the impurity concentration, shows an indication showing a range of the depletion layer. As shown in FIG. 7, when the impurity concentration of the N conductive type column 32b is lower than the concentration satisfying the RESURF condition, a most part of the N conductive type column 32b is depleted even if the MOSFET 10 turns on. Thus, the on-state resistance of the MOSFET 10 is comparatively high. In FIG. 7, whole part of the N conductive type column 32b is depleted, so that the MOSFET 10 may not turn on electricity. Actually, a part of the N conductive type column 32b provides an electric conduction region. Since the curve showing the space charge density is rapidly reduced near a left side of FIG. 7, it is considered that a carrier for contributing the electric conduction exists. The range, in which the space charge density is equal to or larger than a half of the impurity concentration, may not accurately coincide with the indication showing the range of the depletion layer. However, it is considered that the range, in which the space charge density is equal to or larger than the half of the impurity concentration, shows the indication showing the range of the depletion layer. The depletion layer is disposed in a range 51a. Reference numerals 52a-52d in FIGS. 7-10 represents the space charge density in the P conductive type column 32a.

Thus, when the impurity concentration of the N conductive type column 32b in the super junction structure 30 is lower than the concentration satisfying the RESURF condition, the on-state resistance of the MOSFET 10 is comparatively high. This is because the impurity concentration is low, and a comparatively wide area of the N conductive type column 32b is depleted and an electric conduction area does not expand even if the MOSFET 10 turns on.

In this disclosure, although the on-state resistance of the MOSFET 10 is a slight high, the impurity concentration of the N conductive type column 32b is set to be lower than the concentration satisfying the RESURF condition. Thus, these conditions are opposite to the prior art.

Here, even when the impurity concentration of the N conductive type column 32b is set to be lower than the concentration satisfying the RESURF condition, it does not occur that the super junction structure is completely depleted when the MOSFET 10 turns off so that the breakdown voltage is reduced. The charge balance between the N conductive type column 32b and the P conductive type column 32a is satisfied.

Figure 8:
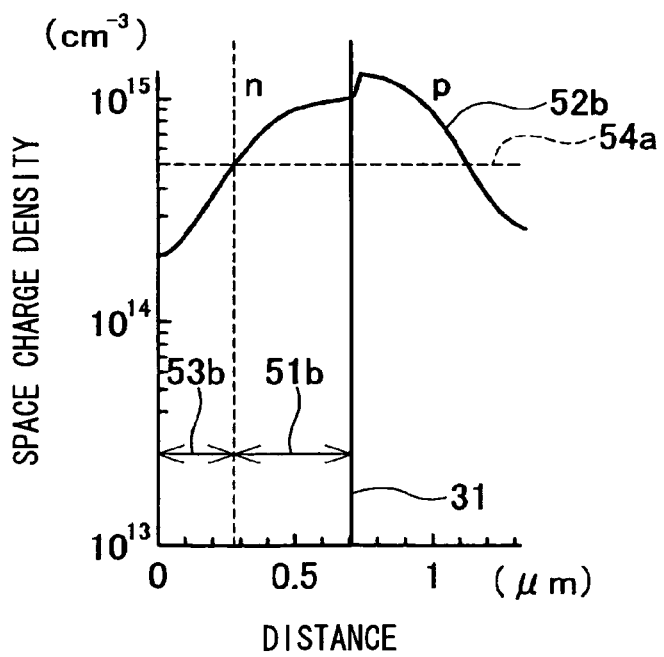
FIG. 8 is a graph showing a space charge density at 150° C. when the impurity concentration of an N conductive type column is $1 \times 10^{15}$ cm$^{-3}$.

FIG. 8 shows a relationship between space charge density and a depletion layer when the impurity concentration of the N conductive type column 32b is $1 \times 10^{15}$ cm$^{-3}$, the temperature is 150° C., and the MOSFET 10 turns on. In this case, the range 51b, in which the space charge density is equal to or larger than a half of the impurity concentration, is depleted. However, the range 53b, in which the space charge density is smaller than the half of the impurity concentration, has electric conductivity. When the impurity concentration of the N conductive type column 32b in the super junction structure 30 is lower than the predetermined concentration satisfying the RESURF condition, the electric conduction area expands in accordance with temperature increase, so that the resistance is reduced.

When the impurity concentration of the N conductive type column 32b in the super junction structure 30 is lower than the predetermined concentration satisfying the RESURF condition, although the lattice scattering is much activated with temperature increase so that the on-state resistance increases, the electric conduction area expands so that the on-state resistance decreases. In this case, the decrease of the on-state resistance is superior to the increase of the on-state resistance, so that the on-state resistance has the negative temperature dependency. Therefore, the curve 42 in FIG. 6 has the negative temperature dependency.

Figure 9:
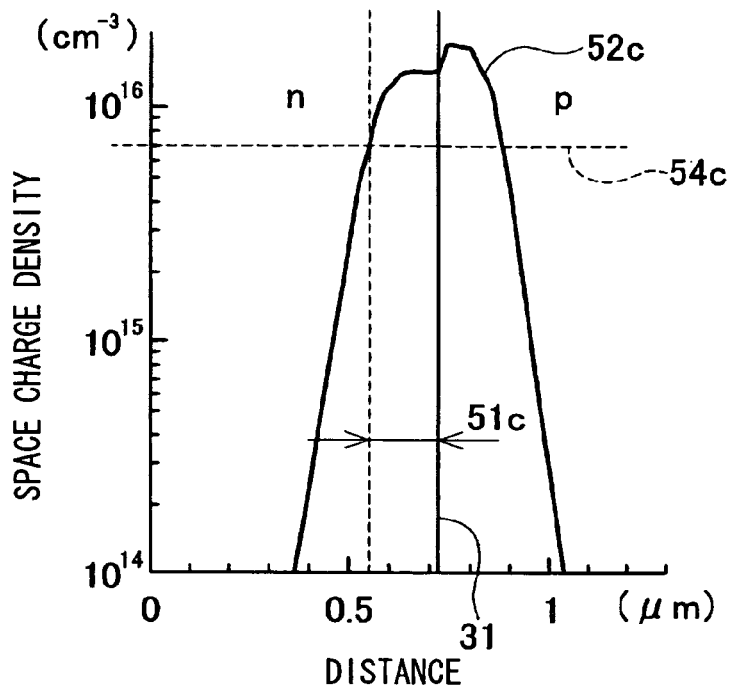
FIG. 9 is a graph showing a space charge density at 27° C. when the impurity concentration of an N conductive type column is $1.4 \times 10^{16}$ cm$^{-3}$.

FIG. 9 shows a relationship between the space charge density and the depletion layer when the impurity concentration of the N conductive type column 32b is $1.4 \times 10^{16}$ cm$^{-3}$ and the temperature is 27° C. The impurity concentration satisfied the RESURF condition.

A line 54c shows a half of the impurity concentration of the N conductive type column 32a. The depletion layer is disposed in a range 51c. Accordingly, a most part of the N conductive type column 32b is the electric conduction area.

Figure 10:
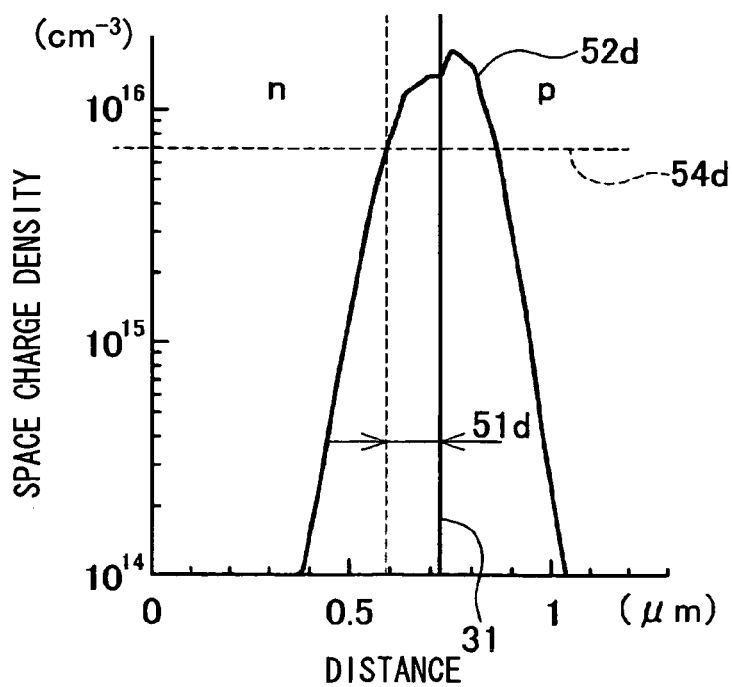
FIG. 10 is a graph showing a space charge density at 150° C. when the impurity concentration of an N conductive type column is $1.4 \times 10^6$ cm$^{-3}$.
Figure 11:
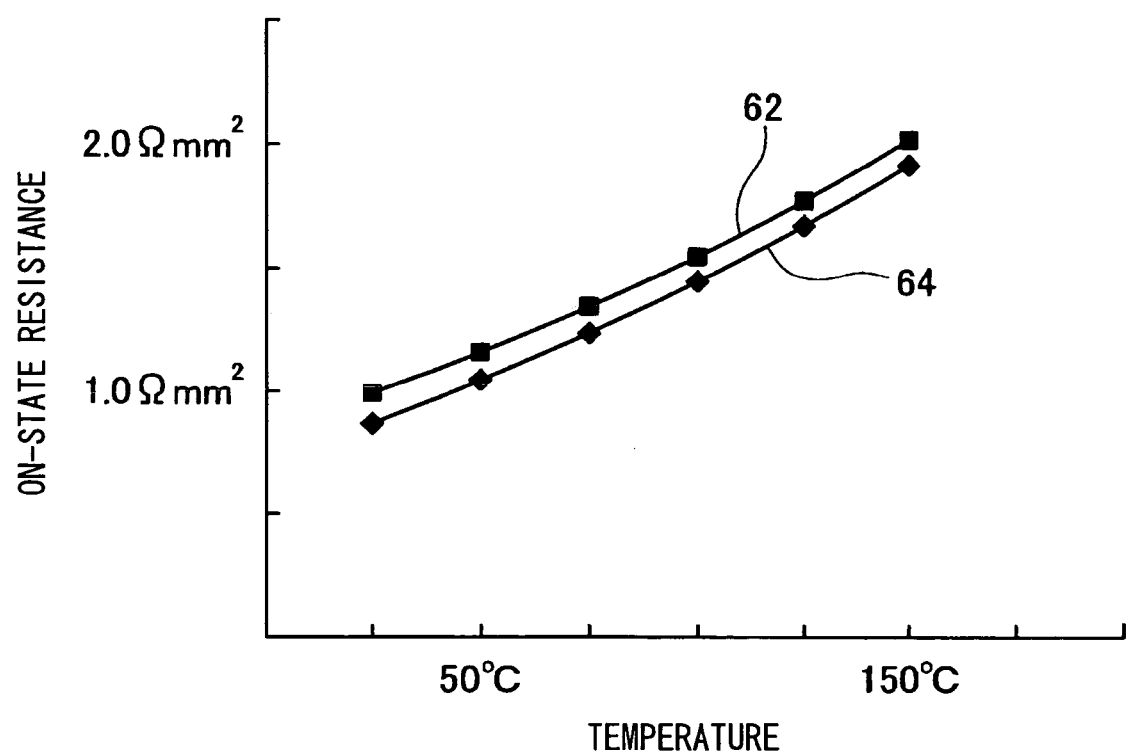
FIG. 11 is a graph showing a relationship between an on-state resistance and a temperature in a semiconductor device according to a prior art.

FIG. 10 shows the relationship between the space charge density and the depletion layer when the impurity concentration of the N conductive type column 32b is $1.4 \times 10^{16}$ cm$^{-3}$ and the temperature is 150° C. In this case, the depletion layer is disposed in a range 51d. Accordingly, a most part of the N conductive type column 32b is the electric conduction area. A dotted line 54d represents a half level of the impurity concentration of the N conductive type column 32b.

When the impurity concentration of the N conductive type column 32b satisfies the RESURF condition, the range, i.e., the width of the depletion layer 51c, 51d are not substantially varied with temperature increase, as shown in FIGS. 9 and 10. Thus, in this case, the electric conduction area does not substantially expand with temperature increase so that the on-state resistance decreases. Accordingly, the negative temperature dependency of the on-state resistance disappears.

Thus, in the semiconductor device such as the MOSFET having the super junction structure, the positive temperature dependency of the on-state resistance attributed to the lattice scattering is cancelled by the negative temperature dependency of the on-state resistance attributed to the expansion of the electric conduction area so that the temperature dependency of the on-state resistance can be reduced. To reduce the temperature dependency of the on-state resistance, it is required that the impurity concentration of the N conductive type column 32b is appropriately controlled. Specifically, the impurity concentration of the N conductive type column 32b does not meet the RESURF condition, and the impurity concentration of the N conductive type column 32b is lower than the predetermined concentration, which meets the RESURF condition.

The negative temperature dependency of the on-state resistance attributed to the expansion of the electric conduction area in accordance with temperature is affected by the width of the N conductive type column 32b (i.e., the width of the N conductive type column 32b in a direction parallel to the stacking direction). When the width of the N conductive type column 32b is large, the rate of expansion of the electric conduction area with reference to the temperature is small, so that the negative temperature dependency is comparatively small. When the width of the N conductive type column 32b is small, the rate of expansion of the electric conduction area with reference to the temperature is large, so that the negative temperature dependency is comparatively large.

The present inventors have confirmed that the positive temperature dependency of the on-state resistance attributed to the lattice scattering effectively is cancelled by the negative temperature dependency attributed to the expansion of the electric conduction area when the impurity concentration of the N conductive type column 32b is equal to or larger than $1 \times 10^{14}$ cm$^{-3}$, which is an actual practical concentration, and the width of the N conductive type column 32b is equal to or smaller than 4.5 μm.

A range surrounded with a dotted lines 37-40 in FIG. 2 provides that the breakdown voltage of the device is comparatively high attributed to the super junction structure 30, the on-state resistance of the device is comparatively small attributed to the super junction structure 30, and the temperature dependency of the on-state resistance with respect to the temperature attributed to the temperature is comparatively small, i.e., stabilized attributed to the super junction structure.

When the width of the column, through which the carrier flows between the main electrodes, is equal to or smaller than 4.5 μm, and the impurity concentration of the column 32b is lower than the predetermined concentration satisfying the RESURF condition, i.e., when a region disposed on a lower left side under the curves 37, 38, the positive temperature dependency of the on-state resistance attributed to the lattice scattering is cancelled by the negative temperature dependency attributed to the expansion of the electric conduction area with respect to the temperature increase. In this case, the temperature dependency of the on-state resistance with respect to the temperature attributed to the temperature is comparatively small, i.e., stabilized attributed to the super junction structure.

Even when the impurity concentration of the N conductive type column 32b is lower than the predetermined concentration satisfying the RESURF condition, the impurity concentration is equal to or lager than $1 \times 10^{14}$ cm$^{-3}$, i.e., in the range disposed above the dotted curve 39, the on-state resistance is comparatively small although the on-state resistance is not a minimum resistance at the RESURF condition. Specifically, in this case, the on-state resistance is a practical small resistance. In this case, the on-state resistance of the device is comparatively small attributed to the super junction structure 30.

When the width of the column 32b is equal to or larger than 0.1 μm, i.e., in a range disposed on a right side of the dotted line 40, the electric conduction area is provided when the device turns off.

Further, even when the impurity concentration of the N conductive type column 32b is smaller than the predetermined concentration satisfying the RESURF condition, the super junction structure 30 is completely depleted in a case where the device turns off. Thus, the breakdown voltage becomes high. In this case, the breakdown voltage of the device is comparatively high attributed to the super junction structure 30.

A semiconductor device according to an embodiment example of a present disclosure is explained as follows. The device is, for example, a vertical type semiconductor device having a pair of main electrodes on both sides of a semiconductor substrate. The device has a super junction structure including a N conductive type plate shaped column and a P conductive type plate shaped column, which extend in a vertical direction and are alternately repeated in a stacking direction of the columns. A body region has a P conductive type. A trench gate electrode contacts the N conductive type column. The width of the N conductive type column is equal to or smaller than 4.5 μm. This device functions as a MOS transistor having the super junction structure.

The above device is a vertical type trench gate MOSFET 10, for example.

The MOSFET 10 shown in FIG. 1 includes a N+ conductive type drain layer 12 and a super junction structure 30 disposed on the drain layer 12. The super junction structure 30 extends in a thickness direction, i.e., a vertical direction of FIG. 1, and extends in a direction perpendicular to the thickness direction, i.e., in a direction perpendicular to the drawing of FIG. 1. The structure 30 includes a N conductive type plate shaped column 32b having a N conductive type impurity and a P conductive type plate shaped column 32a having a P conductive type impurity. The P conductive type column 32a extends in parallel to the N conductive type column 32b. The P conductive type column 32a as a second region and the N conductive type column 32b as a first region are alternately repeated in a direction perpendicular to the thickness direction, i.e., in a right-left direction of the drawing. The N conductive type column 32b and the P conductive type column 32a are formed to have a plate shape. Thus, the N conductive type column 32b and the P conductive type column 32a are arranged to be a stripe pattern. One of the N conductive type columns 32b is sandwiched between two adjacent P conductive type columns 32a, and one of the P conductive type columns 32a is sandwiched between two adjacent N conductive type columns 32b.

The width of the N conductive type column 32b in the horizontal direction, i.e., the right-left direction of the drawing, is set to be 1.4 μm. The width of the P conductive type column 32a in the horizontal direction is set to be 1.2 μm. The impurity concentration of the N conductive type column 32b is $1.3 \times 10^{15}$ cm$^{-3}$, and the impurity concentration of the P conductive type column 32a is $1.5 \times 10^{15}$ cm$^{-3}$. The product of the width of the N conductive type column 32b and the impurity concentration of the N conductive type column 32b does not meet the RESUFR condition. In this case, the concentration satisfying the RESURF condition is $1.4 \times 10^{16}$ cm$^{-3}$. However, the charge balance between the N conductive type column 32b and the P conductive type column 32a is maintained.

When the MOSFET 10 turns off, the depletion layer expands from the PN junction interface 31 between the N conductive type column 32b and the P conductive type column 32a into the N conductive type column 32b. Further, the depletion layer expands from the PN junction interface 31 between the N conductive type column 32b and the P conductive type column 32a into the P conductive type column 32a. Even when the impurity concentration of the N conductive type column 32b does not meet the RESURF condition, i.e., even when the impurity concentration of the N conductive type column 32b is $1.3 \times 10^{15}$ cm$^{-3}$, which is lower than $1.4 \times 10^{16}$ cm$^{-3}$, the depletion layer expanding in the N conductive type column 32b links. Here, the RESURF condition provides not to deplete completely if the impurity concentration is equal to or larger than the RESURF condition. However, the column 32b may be depleted completely when the impurity concentration is smaller than the RESURF condition.

The P conductive type body layer 24 is formed on the surface of the super junction structure 30. The N+ conductive type source region 26 and the P+ conductive type body-contact region 28 are selectively formed on the surface of the P conductive type body layer 24. The trench gate electrode 20 is formed to penetrate the P conductive type body layer 24, which divides the N+ conductive type source region 26 and the N conductive type column 32b. The trench gate electrode 20 is electrically isolated from the P conductive type body layer 24 with the insulation film 18.

The curve 48 in FIG. 6 shows a relationship between the change rate of the on-state resistance and the temperature in the semiconductor device according to the present embodiment. The vertical axis represents the change rate of the on-state resistance with reference to the temperature when the on-state resistance at 27° C. is used as the reference. The horizontal axis represents the temperature in a range between 27° C. and 150° C. The impurity concentration of the N conductive type column 32b is $1.3 \times 10^{15}$ cm$^{-3}$, and the width of the N conductive type column 32b sandwiched between two P conductive type columns 32a is 1.4 μm. In this case, the change rate of the on-state resistance maintains substantially 1.0 with reference to the temperature.

In the left below side of the curves 37, 38 shown in FIG. 2, the positive temperature dependency of the on-state resistance attributed to the lattice scattering is effectively cancelled by the negative temperature dependency of the on-state resistance attributed to the expansion of the electric conduction area with reference to the temperature. Further, it is preferable to be in the left below side of the curve 36 in the region surrounded with the curves 37-40.

The present inventors have determined that the change rate of the on-state resistance is much reduced when the impurity concentration is controlled based on the width of the column 32a, 32b, through which a carrier flows. Specifically, it is in the range surrounded with the curve 36 and the dotted lines 39, 40. That is: the impurity concentration is equal to or smaller than $1 \times 10^{14}$ cm$^{-3}$ when the width of the column is 4.5 μm; the impurity concentration is equal to or smaller than $1 \times 10^{15}$ cm$^{-3}$ when the width of the column is 2.0 μm; the impurity concentration is equal to or smaller than $1 \times 10^{16}$ cm$^{-3}$ when the width of the column is 0.65 μm; and the impurity concentration is equal to or smaller than $1 \times 10^{17}$ cm$^{-3}$ when the width of the column is 0.2 μm. Further, the width of the column is equal to or larger than 0.1 μm, and the impurity concentration is equal to or larger than $1 \times 10^{14}$ cm$^{-3}$. In the above case, the on-state resistance R1 at 27° C. and the on-state resistance R2 at 150° C. have the relationship of R2/R1<1.8.

When the impurity concentration and the width of the column is disposed in the range surrounded with the curve 36 and the dotted lines 39, 40, the negative temperature dependency attributed to the expansion of the electric conduction area is effectively introduced.

Figure 3:
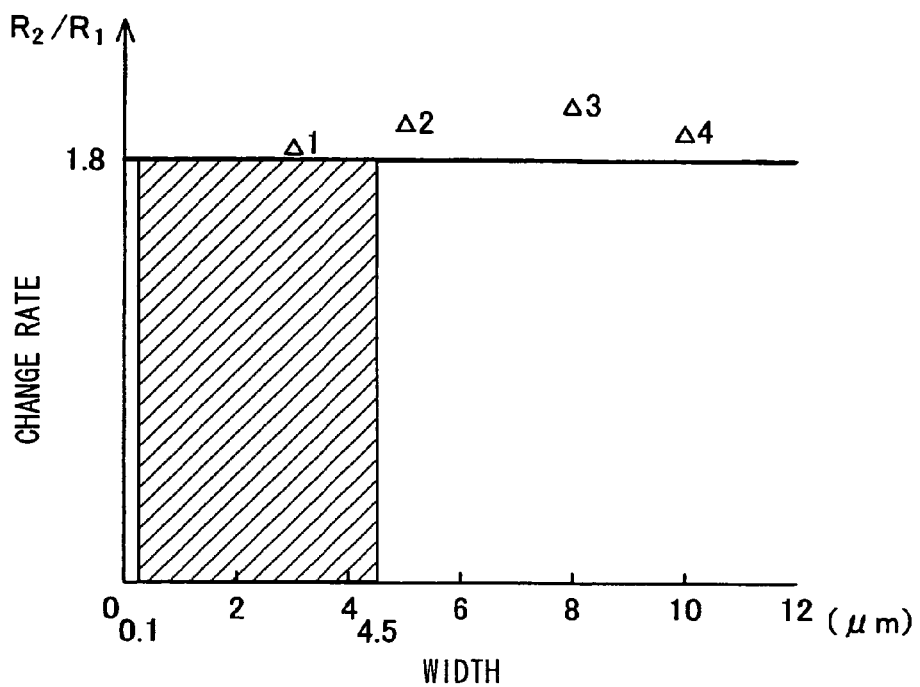
FIG. 3 is a graph showing a relationship between the width of the column and an on-state resistance.

As shown in FIG. 3, when the width of the column, through which the carrier flows, is in a range between 0.1 μm and 4.5 μm, the relationship of R2/R1>1.8 is obtained. Thus, by using the characteristics of the super junction structure, the change rate of the on-state resistance with reference to the temperature is controlled and limited.

Preferably, the impurity concentration and the width of the column is disposed in a right above side of the curve 35 in the range surrounded with the curve 36 and the dotted lines 39, 40. In this case, the ratio between the on-state resistances R1, R2 becomes approximately 1.0. Specifically, it is in the range surrounded with the curves 35, 36 and the dotted line 39. That is: the impurity concentration is equal to or larger than $1 \times 10^{17}$ cm$^{-3}$ when the width of the column is 0.1 μm; the impurity concentration is equal to or larger than $1 \times 10^{16}$ cm$^{-3}$ when the width of the column is 0.3 μm; the impurity concentration is equal to or larger than $1 \times 10^{15}$ cm$^{-3}$ when the width of the column is 1.0 μm; and the impurity concentration is equal to or larger than $1 \times 10^{14}$ cm$^{-3}$ when the width of the column is 2.5 μm. Further, the impurity concentration is equal to or larger than $1 \times 10^{14}$ cm$^{-3}$. In the left below side of the curve 36, the ratio R2/R1 is not much smaller than 1.0, i.e., the relationship of R2/R1<<1 is not performed. Thus, the ratio R2/R1 becomes approximately 1.0. Accordingly, by using the characteristics of the super junction structure, the change rate of the on-state resistance with reference to the temperature is much reduced.

The above device includes a pair of main electrodes, one of which is disposed on a foreside and the other one of which is disposed on a backside of the substrate. Alternatively, both main electrodes may be disposed on a foreside or a backside of the substrate. Although the device includes the trench gate electrode, the device may include a planar gate electrode. Although the above device is FET, the device may be a transistor having a PN junction. Alternatively, the device may be a diode. The device has the super junction structure having the P conductive type columns and the N conductive type columns providing the stripe pattern and being alternately repeated. Alternatively, the super junction structure may have a checkered pattern. Further, the super junction structure may have a honeycomb pattern. Furthermore, the super junction structure may be such that the first region having a columnar shape is arranged and dispersed in the second region expanding continuously.

The above disclosure has the following aspects.

According to an aspect of the present disclosure, a semiconductor device includes: a pair of main electrodes for conducting a carrier having a first conductive type therebetween; a plurality of first regions having the first conductive type and extending along with an extending direction, which is parallel to a direction connecting between the pair of main electrodes; and a plurality of second regions having a second conductive type and extending along with the extending direction. The first regions and the second regions are alternately repeated along with a repeat direction perpendicular to the extending direction so that each first region is sandwiched between two of the second regions and each second region is sandwiched between two of the first regions. The first region has a first impurity concentration and a first width, which is measured along with the repeat direction. The second region has a second impurity concentration and a second width, which is measured along with the repeat direction. A product of the first impurity concentration and the first width is equal to a product of the second impurity concentration and the second width. The first width is equal to or smaller than 4.5 µm. The first impurity concentration is lower than a predetermined impurity concentration satisfying a RESURF condition. The device has an on-state resistance at 27° C. defined as R1 and another on-state resistance at 150° C. defined as R2. A ratio between the on-state resistance of R2 and the on-state resistance of R1 is smaller than 1.8.

In the above device, the on-state resistance is comparatively low, the breakdown voltage is comparatively high, and the change rate of the on-state resistance with respect to temperature is small.

Alternatively, the device may further include: a drift region provided by a super junction structure, which is provided by the first and second regions; a drain region disposed on one side of the drift region; and a body region disposed on the other side of the drift region. The drift region, the drain region and the body region provide a MOS semiconductor element. Further, the device may provide a resistor in a circuit. In this case, the circuit performs to maintain an output of the device constant with respect to the temperature. Accordingly, the circuit characteristics of the circuit are stable with respect to the temperature since the temperature dependency of the device is small.

Alternatively, the RESURF condition may be such that the product of the first impurity concentration and the first width is $2\times10^{12}$ cm$^{-2}$. Further, the first width may be equal to or larger than 0.1 µm, and the first impurity concentration may be equal to or larger than $1\times10^{14}$ cm$^{-3}$. Furthermore, the first impurity concentration and the first width may be disposed in a range sandwiched between a first curve and a second curve. The first curve defines a relationship between the first impurity concentration and the first width and passes through four points such that: the first impurity concentration is $1\times10^{14}$ cm$^{-3}$ when the first width is 4.5 µm; the first impurity concentration is $1\times10^{15}$ cm$^{-3}$ when the first width is 2.0 µm; the first impurity concentration is $1\times10^{16}$ cm$^{-3}$ when the first width is 0.65 µm; and the first impurity concentration is $1\times10^{17}$ cm$^{-3}$ when the first width is 0.2 µm. The second curve defines a relationship between the first impurity concentration and the first width and passes through four points such that: the first impurity concentration is $1\times10^{14}$ cm$^{-3}$ when the first width is 2.5 µm; the first impurity concentration is $1\times10^{15}$ cm$^{-3}$ when the first width is 1.0 µm; the first impurity concentration is $1\times10^{16}$ cm$^{-3}$ when the first width is 0.3 µm; and the first impurity concentration is $1\times10^{17}$ cm$^{-3}$ when the first width is 0.1 µm. Further, the device may further include: a drift layer provided by the first and second regions; a drain layer disposed on one side of the drift layer; a body region disposed on the other side of the drift layer; a source region disposed on the body region and opposite to the drift layer; and a trench gate electrode penetrating the source region and the body region and reaching the drift layer. One of the main electrodes provides a source electrode. The other one of the main electrodes provides a drain electrode. The drift layer, the drain layer, the body region, the source region and the trench gate electrode provide a trench gate MOSFET.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
    a pair of main electrodes for conducting a carrier having a first conductive type therebetween;
    a plurality of first regions having the first conductive type and extending along with an extending direction, which is parallel to a direction connecting between the pair of main electrodes; and
    a plurality of second regions having a second conductive type and extending along with the extending direction, wherein
    the first regions and the second regions are alternately repeated along with a repeat direction perpendicular to the extending direction so that each first region is sandwiched between two of the second regions and each second region is sandwiched between two of the first regions,
    the first region has a first impurity concentration and a first width, which is measured along with the repeat direction,
    the second region has a second impurity concentration and a second width, which is measured along with the repeat direction,
    a product of the first impurity concentration and the first width is equal to a product of the second impurity concentration and the second width,
    the first width is equal to or smaller than 4.5 µm, the first impurity concentration is lower than a predetermined impurity concentration satisfying a RESURF condition, the device has an on-state resistance at 27° C. defined as R1 and another on-state resistance at 150° C. defined as R2, and a ratio between the on-state resistance of R2 and the on-state resistance of R1 is smaller than 1.8.

2. The device according to claim 1, further comprising:
a drift region provided by a super junction structure, which is provided by the first and second regions;
a drain region disposed on one side of the drift region; and
a body region disposed on the other side of the drift region, wherein
the drift region, the drain region and the body region provide a MOS semiconductor element.

3. The device according to claim 1, wherein
the device provides a resistor in a circuit.

4. The device according to claim 1, wherein
the RESURF condition is such that the product of the first impurity concentration and the first width is $2\times10^{12}$ cm$^{-2}$.

5. The device according to claim 4, wherein
the first width is equal to or larger than 0.1 μm, and
the first impurity concentration is equal to or larger than $1\times10^{14}$ cm$^{-3}$.

6. The device according to claim 5, wherein
the first impurity concentration and the first width are disposed in a range sandwiched between a first curve and a second curve,
the first curve defines a relationship between the first impurity concentration and the first width and passes through four points such that:
the first impurity concentration is $1\times10^{14}$ cm$^{-3}$ when the first width is 4.5 μm;
the first impurity concentration is $1\times10^{15}$ cm$^{-3}$ when the first width is 2.0 μm;
the first impurity concentration is $1\times10^{16}$ cm$^{-3}$ when the first width is 0.65 μm; and
the first impurity concentration is $1\times10^{17}$ cm$^{-3}$ when the first width is 0.2 μm, and
the second curve defines a relationship between the first impurity concentration and the first width and passes through four points such that:
the first impurity concentration is $1\times10^{14}$ cm$^{-3}$ when the first width is 2.5 μm;
the first impurity concentration is $1\times10^{15}$ cm$^{-3}$ when the first width is 1.0 μm;
the first impurity concentration is $1\times10^{16}$ cm$^{-3}$ when the first width is 0.3 μm; and
the first impurity concentration is $1\times10^{17}$ cm$^{-3}$ when the first width is 0.1 μm.

7. The device according to claim 6, further comprising:
a drift layer provided by the first and second regions;
a drain layer disposed on one side of the drift layer;
a body region disposed on the other side of the drift layer;
a source region disposed on the body region and opposite to the drift layer; and
a trench gate electrode penetrating the source region and the body region and reaching the drift layer, wherein
one of the main electrodes provides a source electrode,
the other one of the main electrodes provides a drain electrode, and
the drift layer, the drain layer, the body region, the source region and the trench gate electrode provide a trench gate MOSFET.

* * * * *